United States Patent
Chen et al.

(10) Patent No.: US 8,154,721 B2
(45) Date of Patent: Apr. 10, 2012

(54) METHOD OF ONLINE PREDICTING MAINTENANCE OF AN APPARATUS

(75) Inventors: Zhuo Chen, Beijing (CN); Liqiong Hu, Beijing (CN); Kai Xie, Beijing (CN)

(73) Assignee: Beijing NMC Co., Ltd., Beijing (CN)

( * ) Notice: Subject to any disclaimer, the term of this patent is extended or adjusted under 35 U.S.C. 154(b) by 513 days.

(21) Appl. No.: 12/441,032

(22) PCT Filed: Sep. 5, 2007

(86) PCT No.: PCT/CN2007/002654
§ 371 (c)(1), (2), (4) Date: Mar. 12, 2009

(87) PCT Pub. No.: WO2008/034343
PCT Pub. Date: Mar. 27, 2008

(65) Prior Publication Data
US 2010/0042452 A1    Feb. 18, 2010

(30) Foreign Application Priority Data
Sep. 15, 2006 (CN) .......................... 2006 1 0113143

(51) Int. Cl.
*G01J 3/00* (2006.01)
(52) U.S. Cl. ...................................................... 356/300
(58) Field of Classification Search .................. 356/300, 356/326; 438/689, 706; 216/67; 134/1.1
See application file for complete search history.

(56) References Cited

U.S. PATENT DOCUMENTS

| | | | |
|---|---|---|---|
| 5,711,843 A | 1/1998 | Jahns | |
| 6,017,414 A | 1/2000 | Koemtzopoulos et al. | |
| 6,157,447 A * | 12/2000 | Smith et al. | 356/316 |
| 6,652,710 B2 | 11/2003 | Cruse | |
| 6,750,977 B2 * | 6/2004 | Otsubo et al. | 356/316 |
| 6,952,657 B2 | 10/2005 | Jahns et al. | |
| 2004/0125360 A1 * | 7/2004 | Ludviksson et al. | 356/72 |
| 2004/0235303 A1 * | 11/2004 | Wong et al. | 438/689 |
| 2005/0070104 A1 * | 3/2005 | O'Meara et al. | 438/689 |
| 2005/0087297 A1 * | 4/2005 | Kitsunai et al. | 156/345.24 |
| 2006/0021633 A1 * | 2/2006 | Harvey | 134/1.1 |

FOREIGN PATENT DOCUMENTS

| | | |
|---|---|---|
| JP | 11-204499 | 7/1999 |
| WO | WO-2005/111265 | 11/2005 |

* cited by examiner

*Primary Examiner* — Kara E Geisel
(74) *Attorney, Agent, or Firm* — Morgan, Lewis & Bockius LLP

(57) ABSTRACT

A method of online predicting maintenance of an apparatus is disclosed. Using an optical emission spectroscopy (OES) positioned on the apparatus and the change of emission spectrum intensity detected by the OES in the process, according to the detected results, measuring the parameter in the process, the function relation between the process parameter and spectrum intensity is acquired. A control threshold is decided by the processing requirement to the apparatus. When the parameter exceeds the control threshold, maintenance to the etching apparatus is engaged in order to avoid processing error caused by frequent shutdown or deficient maintenance which is estimated by experience, and hence decreasing the cost and increasing processing efficiency of substrates (such as silicon wafers) without changing apparatus and adding other online sensor, and improving production rate by avoiding waste substrates caused by error processing results. The method is suitable for semiconductor substrate etching maintenance of the apparatus and also other maintenance of the apparatus.

8 Claims, 3 Drawing Sheets

METHOD OF ONLINE PREDICTING MAINTENANCE OF AN APPARATUS

BACKGROUND OF THE INVENTION

1. Field of the Invention

The present invention relates, generally, to a method of predicting maintenance of an apparatus, and, more particularly, to a method of online predicting maintenance of an apparatus.

2. Description of the Related Art

With the improvement of semiconductor chip technology, the feature size is keeping decreased from 250 nm to 65 nm, even less than 45 nm; while the size of silicon wafer is increased from 200 mm to 300 mm. As a result, the cost of each individual wafer is increasing, and the requirements to the semiconductor wafer manufacturing process are stricter. The semiconductor manufacturing comprises many process steps including deposition, photolithography and etching process, etc., wherein the etching process is more complex, because the state of plasma and other parameters during the etching process have direct influence upon the result of etching process. With the feature size decreasing, it is more and more important to control and monitor these parameters mentioned above. To meet the above requirements, the Advanced Process Control (APC) technology has been developed.

APC technology mainly includes three aspects, namely malfunction diagnosis and classification, malfunction prediction, and feedback control.

As for the maintenance of the apparatus, the conventional method is to estimate the time when a maintenance operation has to be performed by experience, and carrying out periodic maintenance. In this method, in a testing stage of the apparatus, the time when a maintenance operation has to be performed is estimated by the experimental and processing results so as to control the use and maintenance of the apparatus. Generally, the dry clean period of the apparatus and the replacement period of components are obtained using the determined radio frequency loading time in the apparatus. Such a method may be applied to a process with feature size having larger width because of lower requirement to accuracy. However it is difficult to use in a process wherein feature size is less than 90 nm.

Using this method, the apparatus maintenance period can be estimated only by experience, and it is difficult to predict which part of the apparatus needs to be maintained accurately and quantitatively. The preventive maintenance period may vary with the conditions such as specific process and aging of the apparatus changing, and if the experiential data is varied, the process and the result will be also varied accordingly. Very long period will result in that the change in the working condition in process causes the change in processing result, thus leading to the degrading of wafer quality, and reducing the throughput rate; on the other hands, very short period will lead to frequent maintenance, which will affect disadvantageously regular wafer process, and result in wasting time and decreasing of efficiency.

Another conventional method of predicting the maintenance requirement of the apparatus is using an additional sensor to detect the process, generally, said sensor includes VI probe (radio frequency voltage, current probe) or FTIR (Fourier transform infrared spectroscopy), etc. In the process, these sensors are mainly used to detect progress of process, which can predict maintenance requirement such as dry clean and component replacement by the value of plasma or other processing condition parameters.

The disadvantages of the conventional methods mentioned above are that the cost of apparatus is increased, and the mechanical design of apparatus is needed to change so as to satisfy the additional sensor.

SUMMARY OF THE INVENTION

The object of the present invention is to provide a convenient method to online predict maintenance and replacement of components of apparatus, which can predict the period of maintenance and replacement of components of apparatus effectively and accurately without changing the apparatus or adding any additional components.

The object of present invention is achieved by the following solutions.

According to one aspect of present invention, a method of online predicting maintenance of an apparatus having a chamber and an optical emission spectrometer (OES) mounted on a side wall of the chamber is provided, wherein the method comprises the following steps: Step A of detecting information on intensity of spectrum emitted in the chamber during dry clean process, by using the OES; Step B of quantifying a process parameter in the process based on an analysis of detected information on spectrum intensity; and obtaining a changing trend of the process parameter by fitting the process parameters obtained by detecting and quantifying many times; and Step C of maintaining the apparatus when a value of the process parameter exceeds a control threshold set according to a requirement of the process to the apparatus. Further, the Step A comprises Step A1: detecting changing in intensity of spectrum emitted during dry clean process many times by using the OES, and recording stable time required when intensity of the emitted spectrum detected by the OERS becomes stable during each clean process. The Step B comprises: Step B1, statistically analyzing the stable time recorded each time to obtain a function relation of said stable time with an amount of reactant or product during the dry clean process, and further to determine a changing trend of process parameter; and Step B2, obtaining a function relation of the amount of reactant or product with roughness of the chamber inner wall during the dry clean process, according to the results detected; and further obtaining a changing trend of the stable time with changing of the roughness of the chamber inner walls, so as to obtain a time period of dry clean when the roughness exceeds a normal range. The Step C comprises: Step C1 of performing a maintenance operation to an apparatus component in the chamber when the intensity of spectrum associate with the stable time or the time of dry clean exceeds the control threshold set according to the requirement of the process to the apparatus.

In one embodiment of the present invention, the chamber further comprises a chamber liner and/or a quartz window.

In another aspect of the present invention, a method of online predicting maintenance of an apparatus having a chamber and an optical emission spectrometer (OES) mounted on a side wall of the chamber is provided, the method comprises the following steps: Step A of detecting information on intensity of spectrum emitted during dry clean process of the chamber, by using the OES;

Step B of quantifying a process parameter in the process based on an analysis of detected information on spectrum intensity; and obtaining a changing trend of the process parameter by statistically analyzing the process parameters obtained by detecting and quantifying many times; and Step C of performing a maintenance operation when a value of the process parameter exceeds a control threshold set according to a requirement of the process to the apparatus; wherein, said Step A comprises: Step A2 of detecting a changing trend of the intensity of the emitted spectrum with increasing of number of wafers being processed during the process, by using the OES. The Step B comprises: Step B3 of obtaining a changing trend of a pollution degree of an OES window with the changing of the intensity of the emitted spectrum detected by OES. The Step C comprises Step C2 of performing a maintenance operation to the OES window, when the intensity of emitted spectrum detected by the OES exceeds a control threshold set according to requirement of the process to the apparatus.

From the above technical solutions provided by the present invention, it can be seen that the method of present invented online predicting maintenance of the apparatus uses an inherent OES sensor mounted on the apparatus, and uses OES to detect the change in the intensity of the spectrum emitted in the process; and quantifies the process parameter in the process, according to the analysis to results detected; and by statistically analyzing the spectrum intensity detected and quantified many times, obtains the function relationship of process parameters with the spectrum intensity; then performs a maintenance operation, when the quantified value of the process parameter exceeds a control threshold set according to the requirements of the process to the apparatus. The present invention avoids not only frequent shutdown or the process drift because of insufficient maintenance due to the inaccuracy of conventional maintenance period estimated experimentally; but also changing the apparatus or addition of any other additional online sensor, thereby decreasing cost. The production efficiency of processing substrates (such as silicon wafer) is increased and the waste substrates caused by fault process result are avoided, therefore the yield is improved.

The present invention can be applied to maintenance of not only semiconductor apparatus such as etching apparatus, but also other apparatus.

BRIEF DESCRIPTION OF THE DRAWINGS

These and other aspects and advantages of the invention will become apparent and more readily appreciated from the following descriptions taken in conjunction with the drawings in which.

DETAILED DESCRIPTION OF EMBODIMENTS OF THE INVENTION

Figure 1:
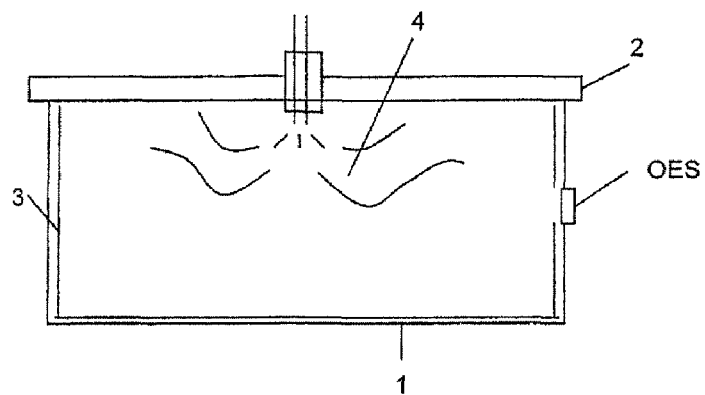
FIG. 1 is an illustrative view showing the states of components in the chamber, when the plasma impacting the components of chamber during substrate processing.

Reference will be made in detail to embodiments of the present invention. The embodiments described herein with reference to drawings are explanatory, illustrative, and used to generally understand the present invention. The embodiments shall not be construed to limit the present invention. The same or similar elements and the elements having same or similar functions are denoted by like reference numerals throughout the descriptions.

The preferred embodiment of present invention is to monitor the information on intensity of the spectrum emitted in process by using an online OES (Optical Emission Spectrograph) so as to obtain damaging level of the components of the apparatus, thereby predicting the replacement of components.

As shown in FIG. 1, wherein the OES is a sensor indispensable to the semiconductor etching apparatus for endpoint detection, which is mounted on a side wall of chamber 1, a quartz window 2 is disposed on the chamber 1, and liner 3 is provided inside the chamber 1. During the substrate etching process (such as silicon wafer), the liner 3, quartz window 2 and other components in the chamber 1 will be bombed by plasma 4.

The method of online predicting maintenance of an apparatus using the OES comprises substantially the following steps:

Step 11, detecting information on intensity of the spectrum emitted during the process by using the OES;

Step 12, quantifying a process parameter in the process according to analysis of the detecting result; and by statistically analyzing the process parameter detected and quantified many times, obtaining a function between the process parameter and information on the spectrum intensity;

Step 13, performing a maintenance operation, when the value of the process parameter exceeds a control threshold set according to requirements of the process to the apparatus.

The process parameters mentioned above include: the time when the intensity of the spectrum emitted and detected by OES gets a stable state in each cleaning process, the number of substrates (such as silicon wafer) processed, the number of substrate (such as silicon wafer) processed, the roughness of the liner 3 and the quartz window 2, or the pollution degree of OES window and the like, or other process parameter needed being analyzed and quantified.

The information on the intensity of OES spectrum refers to substantially the changing or changing trends of the spectrum intensity detected by OES, or other information; the relationship between the information on the intensity of OES spectrum and the process parameters is obtained by experiment or statistic analysis. The information on the intensity of OES spectrum can reflect the state of the components of the apparatus, which should be maintained when the value of the process parameters exceeds the control threshold, where the control threshold is set according to the requirement to apparatus in the process.

Besides OES, other online sensors can also be used to online predicting maintenance of the apparatus in the present invention.

Embodiment 1

The roughness of the quartz window 2 and liner 3 surfaces will increase under the bombardment of plasma 4, thereby their surfaces will no longer be smooth. With the process proceeds, the surfaces will be rougher and rougher. The roughness refers to that: the surface is not entirely smooth, forming microcosmic topography of small spaced-apart peak and valley. Generally, the roughness is measured by the Roughness Tester. Moving the Roughness Tester on a surface of an object to be detected for a certain distance, the roughness of the object can be obtained by calculating the average distance between peak and valley on the path of the tester. When the inner surface of each component are exposed in the chamber, by-products of the process will be attached to the inner surface, and these by-products will become gaseous during dry clean process after each regular process and be extracted. Thus, during dry clean process, monitoring the amount of the products or the reactants will obtain the amount of by-products attached to the inner walls of the chamber in the process. With the roughness of component increasing, the amount of by-products attached in each process will become more and more, and the amount of reactants consumed or the amount of products during the dry clean process will become more and more too, thus the roughness of the components may be obtained by measuring the amount of said products and the reactants.

Using quartz window 2 as an example, the change in intensity of the spectrum of OES during the dry clean process under different roughness is obtained.

Figure 2:
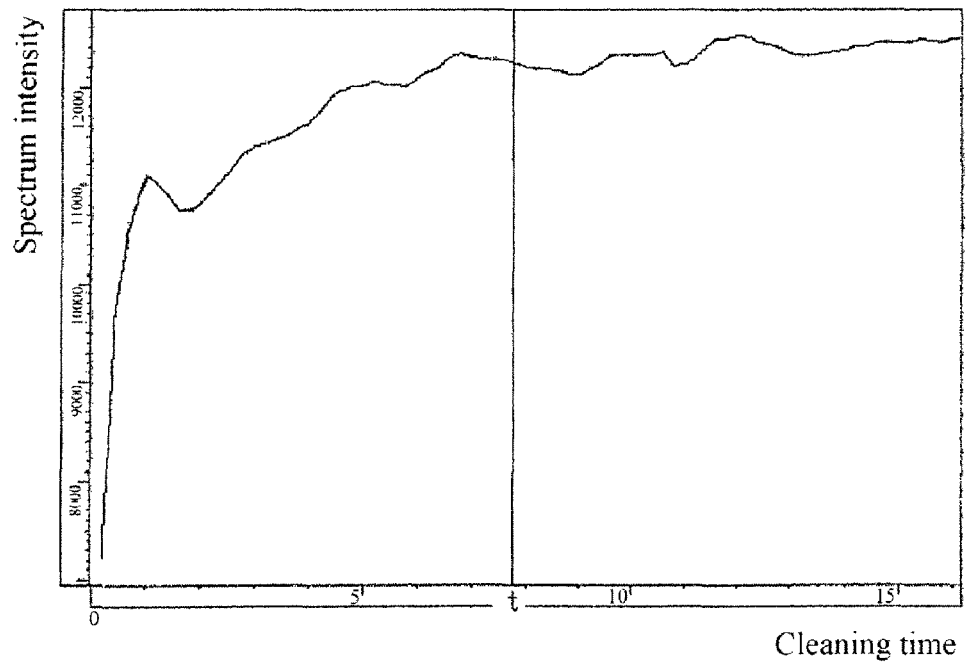
FIG. 2 is Curve 1 showing the changing of OES spectrum intensity with the cleaning time during the dry clean process.

FIG. 2 shows the dry clean spectrum when the average roughness of quartz window 2 is 0.7 μm. The increasing segment of the curve shows that by-product in the chamber reacts, and the stable segment means that the surface has been cleaned, the stable time t=7.8 s. This time is obtained according to the duration time of dry clean when the slope of dry clean spectrum intensity reaches 0.

Figure 3:
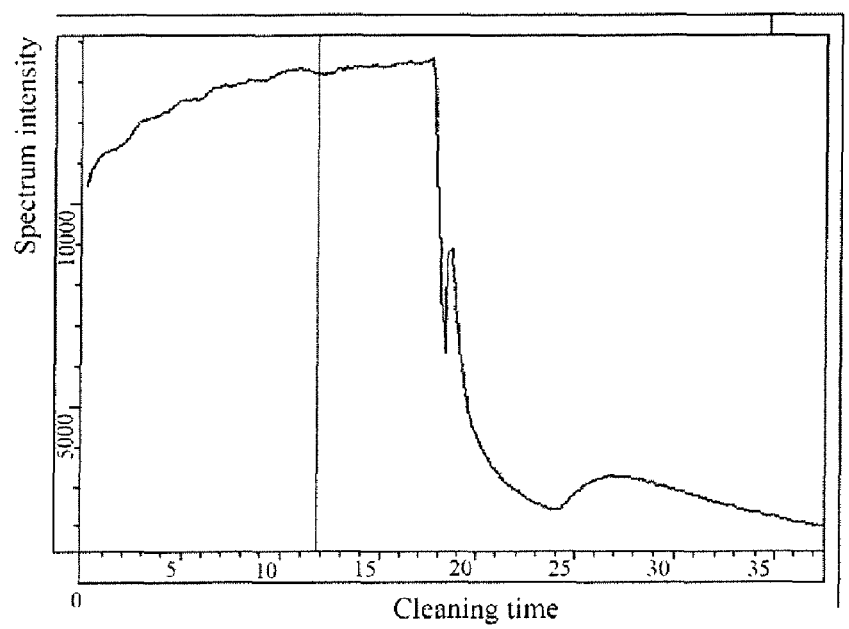
FIG. 3 is Curve 2 showing the changing of OES spectrum intensity with the cleaning time during the dry clean process.

FIG. 3 shows the dry clean spectrum when the average roughness of quartz window is 2.6 μm. The stable time for clean t=12.0 s.

Figure 4:
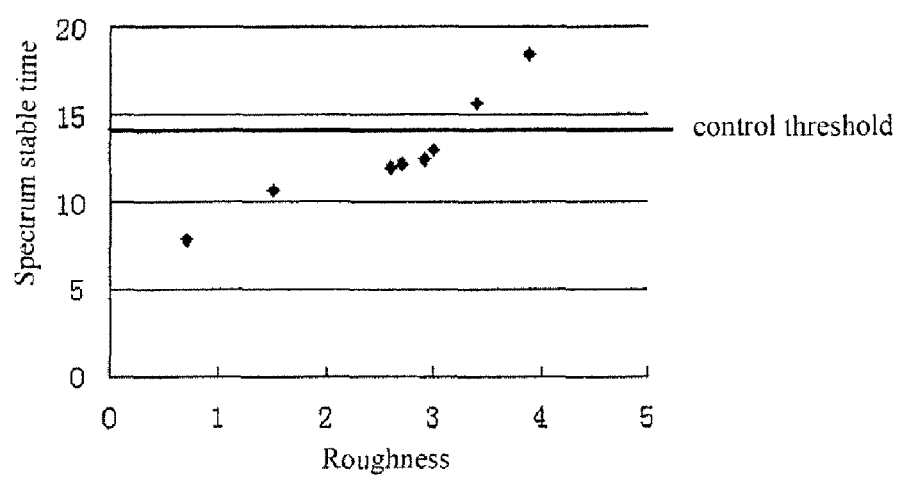
FIG. 4 is a curve showing the changing of the stable time of OES spectrum intensity reaching stable with the roughness degree of the inner wall of chamber during the dry clean process.

As shown in FIG. 4, when using OES to detect the end point of dry clean process, the relationship between the final stable time t of dry clean and the roughness of quartz window 2 is established, and the time when the quartz window should be replaced is detected, the stable time t, to which the roughness corresponds to, of dry clean is used as the control threshold. When the final stable time t of dry clean increases and exceeds the control threshold, it means that the roughness of quartz window 2 has exceeded a standard value and quartz window 2 should be replaced, thereby the replacement of quartz window 2 is predicted in time and accurately.

The method preferably comprises the following steps:

Step 21, detecting the change of the intensity of the emitted spectrum detected by OES during the dry clean process in chamber 1 many times, and recording the time t for the intensity of the emitted spectrum detected by OES reaching stable during each dry clean process.

Step 22, obtaining a relationship between the spectrum intensity value and the cleaning time, according to the recorded time t in each detecting step and the amount of reactant or product during the dry clean process, namely the spectrum intensity value in some specific wavelengths during the dry clean process.

Step 23, recording detected roughness values of the quartz window in every stage, and obtaining the function relationship of the roughness on the inner walls of component in chamber 1 with the dry clean time t according to the detected results of roughness.

Step 24, setting a control threshold according to processing requirements to the chamber component, and when the stable time t exceeds the control threshold, performing the maintenance operation to the chamber component.

Embodiment 2

The replacement of the OES window may be predicted by means of the change of OES spectrum intensity during regular processes, wherein a certain distance exists between the OES window and the plasma. This method deals mainly with the OES window. By-products will fall on the surface of OES window during the process and this position is hard to be cleaned in dry clean process, thus the OES spectrum intensity will gradually decrease with the times of the process being repeated increasing. Therefore the changing trend of average value of the OES spectrum in regular process is measured and a control threshold is set, so when the average value goes below the control threshold, it means that the OES window has been polluted and should be replaced. Thus, the replacement of OES window can be predicted by detecting the change of OES spectrum intensity.

Figure 5:
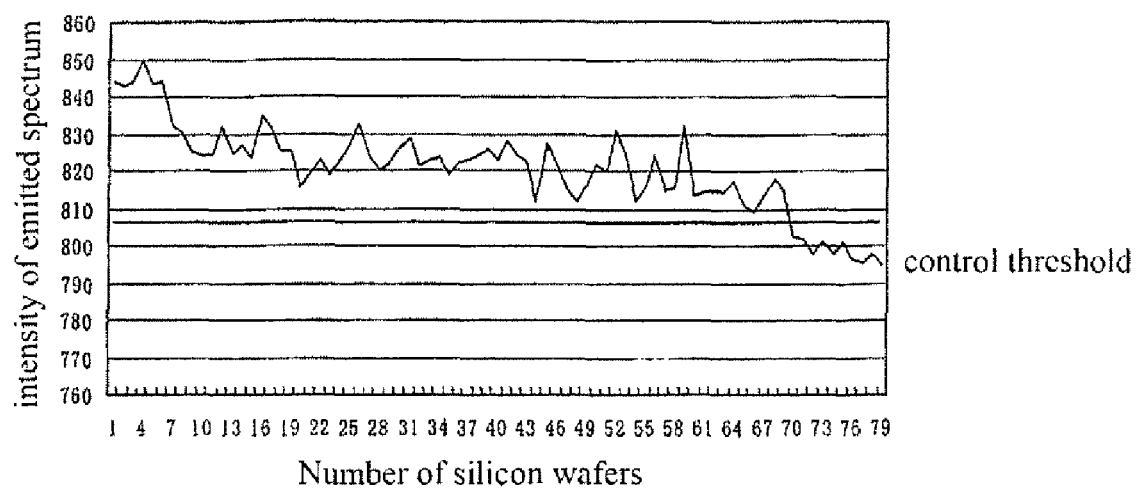
FIG. 5 is a curve showing the changing of the OES spectrum intensity with the increasing amount of the substrates manufactured during substrate processing.

FIG. 5 shows the relationship between the number of substrates (such as silicon wafers) processed with the intensity of the emitted spectrum detected by OES, when the number of substrates (such as silicon wafers) increases, the OES intensity will decrease gradually, showing that the OES window is polluted gradually, and when the OES intensity is lower than the control threshold, the OES window should be cleaned or replaced.

Particularly, the above method comprises the following steps:

Step 51, detecting the changing trend of the intensity of emitted spectrum detected by OES with the number of substrates (such as silicon wafers) increases, when the substrates (such as silicon wafers) are processed, as shown in FIG. 5. Generally, the trend has a simple and linear shape, that is, when the number of substrates being processed is increased, the emitted spectrum intensity will decrease linearly;

Step 52, obtaining a changing trend of pollution degree of OES window with the emitted spectrum intensity by OES, according to the changing trend of intensity of the emitted spectrum detected by OES with the increasing the number of substrates (such as silicon wafers);

Step 53, setting a control threshold according to the requirements of the process to the OES quartz window, and performing maintenance operation to OES quartz window if the intensity of the emitted spectrum detected by OES exceeds said threshold.

The present invention mainly uses online sensors, detects and analyzes the process combined with an analysis method to a single variant or multiple variants, predicts the replacement of component, such as using the OES sensor to detect the process in the apparatus in real time. When the process proceeds time and time, the changing of OES spectrum during dry clean process is observed, and associated with the hardware condition in the chamber. Or the changing trend of OES spectrum is used to obtain the consumption degree of the chamber hardware, and then the maintenance of chamber and the replacement of component can be predicted. By this way, the present invention can avoid to determine the replacement by experience, and prevent effectively wasting time by changing component frequently or shifting the process result by very long replacement time estimated, without adding any additional component.

The above discussions are used only to provide preferred embodiments, not to limit the protection scope of the present invention. Under the above teaching of the present invention, those skilled in the art can modify or amend the embodiments easily, and these modification or amendments should be also within the scope of present invention.

What is claimed is:

1. A method of online predicting maintenance of an apparatus having a chamber and an optical emission spectrometer (OES) mounted on a side wall of the chamber, comprising:

step A of detecting an intensity of a spectrum emitted during a dry clean process of the chamber, by using the OES;

step B of quantifying a process parameter in the process based on an analysis of the spectrum intensity; and obtaining a changing trend of the process parameter by statistically analyzing the process parameters obtained by detecting and quantifying many times and obtaining function relation between the process parameter and the intensity of the spectrum; and step C of performing a maintenance operation when a value of the process parameter exceeds a control threshold set according to a requirement of the process to the apparatus.

2. The method according to claim 1, wherein said step A comprises: step A1 of detecting an intensity of the spectrum emitted during the dry clean process many times, by using the OES, to determine a change in the intensity, and recording stable time required when intensity of the emitted spectrum detected by the OES becomes stable during each clean process.

3. The method according to claim 2, wherein said step B comprises: step B1 of statistically analyzing the recorded stable time to obtain a function relation between said stable time and an amount of reactant or product used during the dry clean process, and further to determine a changing trend of process parameter;

step B2 of obtaining a function relation between the amount of reactant or product and the roughness of the chamber inner wall during the dry clean process, according to the results detected; and further obtaining a changing trend of the stable time with changing of the roughness of the chamber inner walls, so as to obtain a time period of dry clean when the roughness exceeds a normal range.

4. The method according to claim 3, wherein said step C comprises: step C1 of performing a maintenance operation to a component of the chamber when the intensity of spectrum associated with the stable time or the time of dry clean exceeds the control threshold set according to the requirement of the process to the apparatus.

5. The method according to claim 1, wherein the chamber comprises a liner and/or a quartz window.

6. A method of online predicting maintenance of an apparatus having a chamber and an optical emission spectrometer (OES) mounted on a side wall of the chamber, comprising:

step A of detecting an intensity of the emitted spectrum with increasing of number of substrates being processed during a process, by using the OES, to determine a change in the intensity;

step B of quantifying a process parameter in the process based on an analysis of the spectrum intensity; and obtaining a changing trend of the process parameter by statistically analyzing the process parameters obtained by detecting and quantifying many times; and step C of performing a maintenance operation when a value of the process parameter exceeds a control threshold set according to a requirement of the process to the apparatus.

7. The method according to claim 6, said step B comprises: step B3 of obtaining a changing trend of a pollution degree of an OES window with the changing of the intensity of the emitted spectrum detected by OES.

8. The method according to claim 7, said step C comprises: step C2 of performing a maintenance operation to the OES window, when the intensity of emitted spectrum detected by the OES exceeds a control threshold set according to requirement of the process to the apparatus.

* * * * *